United States Patent [19]

Nagamine

[11] Patent Number: 5,534,724
[45] Date of Patent: Jul. 9, 1996

[54] SEMICONDUCTOR MEMORY DEVICE

[75] Inventor: Hisayuki Nagamine, Tokyo, Japan

[73] Assignee: NEC Corporation, Tokyo, Japan

[21] Appl. No.: 257,583

[22] Filed: Jun. 9, 1994

Related U.S. Application Data

[63] Continuation of Ser. No. 743,635, Aug. 12, 1991, abandoned.

[30] Foreign Application Priority Data

Aug. 13, 1990 [JP] Japan ..................... 2-213919

[51] Int. Cl.⁶ ........................... H01L 29/76; H01L 29/94; H01L 31/062; H01L 31/113
[52] U.S. Cl. .................... 257/390; 257/394; 257/202
[58] Field of Search .................... 257/390, 394; 365/202

[56] References Cited

U.S. PATENT DOCUMENTS 4,891,792  1/1990  Hanamura .................... 365/202

*Primary Examiner*—Stephen D. Meier
*Attorney, Agent, or Firm*—Sughrue, Mion, Zinn, Macpeak & Seas

[57] ABSTRACT

A semiconductor memory device according to the present invention comprises a substantially rectangular memory cell array region formed on a surface of a semiconductor substrate, a bit line balancing circuit disposed adjacent to a predetermined side of the memory cell array region and having a first circuit layout pattern, a bit line potential supply circuit disposed outside the bit line balancing circuit remote from the memory cell array region and having a second circuit layout pattern and a first dummy wiring region disposed outside the bit line potential supply circuit remote from the memory cell array region and having a circuit layout pattern substantially the same as the first layout pattern. With this, reduction of mutual conductance of transistors constituting a peripheral circuit can be prevented and reduction of read/write rate of the semiconductor memory device and malfunction thereof are also prevented.

7 Claims, 9 Drawing Sheets

SEMICONDUCTOR MEMORY DEVICE

BACKGROUND OF THE INVENTION

This is a Continuation of application Ser. No. 07/743,635 filed Aug. 12, 1991 now abandoned.

1. Field of the Invention

The present invention relates to a semiconductor memory device and, particularly to a peripheral circuit of a static random access memory (SRAM), 2. Description of the Prior Art In general, a semiconductor memory device such as SRAM comprises a memory cell array area and peripheral circuits including such as decoder circuits and bit line potential supply circuits arranged adjacent to the memory cell array area. .Among these peripheral circuits, specific peripheral circuits such as a bit line balance circuit for balancing potentials of a pair of bit lines in the memory cell array and the bit line potential supply circuit have to be arranged for each bit line pair. Therefore, these specific peripheral circuits are usually arranged along one side of the rectangular memory cell array area, that is, adjacent to one side of a peripheral portion of a memory chip. Gate electrodes of field effect transistors (FETs) constituting these specific peripheral circuits are usually formed from polysilicon films and a pattern density thereof is very high.

In such semiconductor memory ,device including such peripheral circuits having such constructions, a wiring having a predetermined, highly dense pattern is provided in an area between the memory cell array area and these peripheral circuits. However, an outermost one of these peripheral circuits, that is, a circuit arranged in an outermost peripheral portion of the memory chip, which may be a portion of the bit line potential supply circuit, may have one side in contact with an outer peripheral portion of the memory chip in which substantial wiring does not exist. In such area, the wiring pattern density changes from high to low, breaking a regularity thereof.

The present inventor has found that, in the vicinity of such area in which the wiring pattern density changes, wiring width tends to increase from a designed value compared with other areas in which the regularity of wiring pattern is maintained. When wiring width, particularly, width of wiring for polysilicon which is used as a gate electrode of a transistor increases beyond the designed value, a channel length of the transistor becomes larger than a designed value, ultimately. For example, in a case where a design width of polysilicon wiring is 0.8 μm, it may increased by about 0.06 μm and the channel length of the transistor having the wiring as the gate electrode is increased correspondingly thereto.

The reason for why the wiring width in such area tends to increase from the designed value may be as follow: An irregularity of wiring pattern may cause diffraction of light in a lithography step for selectively removing polysilicon film, that is, in an exposing step with using a predetermined mask after photoresist formation, to alter exposing conditions in such a way that width of polysilicon film selectively left changes in an increasing direction. As mentioned previously, circuit portion which is subjected to such effect is that disposed in the outermost portion of the outer periphery of the memory chip and such circuit portion is usually a portion of the bit line potential supply circuit. When the channel length of transistor constituting the potential supply circuit increases, mutual conductance of the transistor is lowered correspondingly, resulting in a degraded potential supply capability for bit line.

Such degradation of potential supply capability for bit line may cause a delay of potential change of bit line in reading or writing signal and, therefore, it may not only substantially reduce write/read rate of a semiconductor memory device but also cause malfunction thereof to occur.

BRIEF SUMMARY OF THE INVENTION

Object of the Invention

An object of the present invention is, therefore, to provide a semiconductor memory device capable of preventing transconductance of transistors forming peripheral circuits from being reduced, preventing read/write rate of the device from being reduced and preventing any malfunction of the device from occuring.

Summary of the Invention

A semiconductor memory device according to the present invention comprises a plurality of substantially rectangular memory cell array regions formed on a surface of a semiconductor substrate, bit line balancing circuits each disposed adjacent to a predetermined one side of one of the memory cell array regions and having a first, predetermined wiring pattern, bit line potential supply circuits each disposed outside a corresponding one of the bit line potential supply circuits and having a second, predetermined wiring pattern and first dummy wiring regions each disposed outside a corresponding one of the bit line potential supply circuits and having a pattern substantially similar to the first wiring pattern.

The semiconductor memory device according to the present invention further comprises a pair of second dummy wiring regions arranged in both sides of each of the bit line balancing circuit and having patterns similar to the second wiring pattern.

Preferably, the first and second dummy wiring regions are formed in the same manufacturing step as that for forming wiring patterns of the bit line balancing circuits and the bit line potential supply .circuits.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
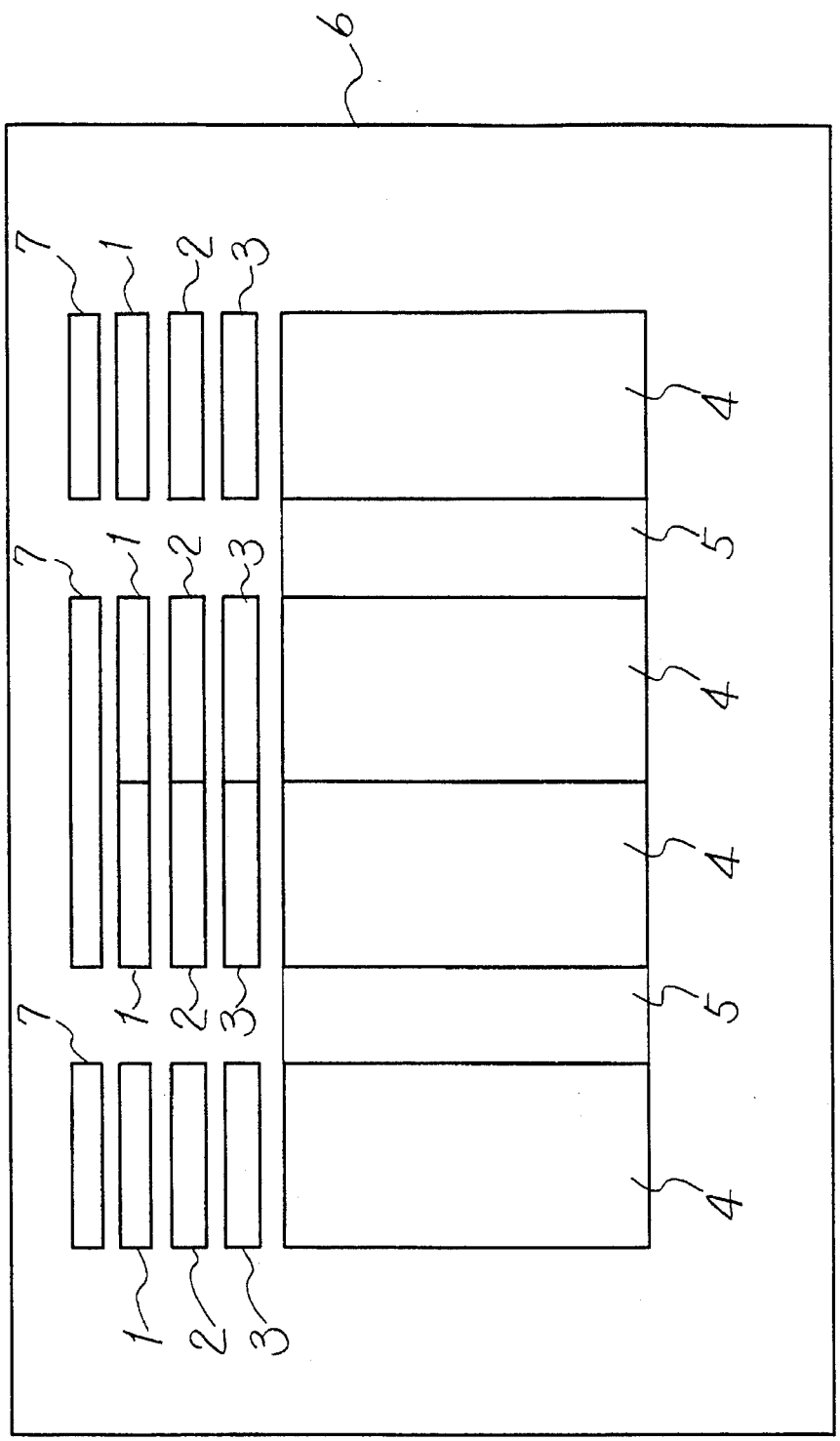
FIG. 1 is a plan view schematically showing a whole of a semiconductor memory device according to a first embodiment of the present invention.

Referring to FIG. 1, a semiconductor chip 6 constituting a semiconductor memory device according to the present invention comprises memory cell array regions 4 in which memory cells are arranged in array, bit line balancing circuits 3 for balancing bit line pair in potential and a bit line potential supply circuit composed of a first and a second bit line potential supply circuit portions 1 and 2 for supplying potential to the bit line pairs. A line decoder 5 is arranged between adjacent ones of the memory cell array regions 4 for selecting word lines according to input addresses. It should be noted that the semiconductor memory device includes other circuits as its peripheral circuit than those shown although these circuits are not shown for simplicity of illustration.

Since the bit line balancing circuits 3 and the bit line potential supply circuit (1, 2) are to be connected to bit line pairs constituting the memory cell array regions 4, respectively, these circuits are arranged adjacent the memory cell array regions 4. In detail, each bit line balancing circuit 3 is arranged along side of the memory cell array region 4 and the bit line potential supply circuit (1, 2) are arranged outside of the bit line balancing circuit 3 remote from the memory cell array region 4.

Further, dummy wiring regions 7 are provided in far sides of the bit line potential supply circuit from the memory cell array regions 4, respectively. As to be described later in detail, the dummy wiring region 7 comprises a polysilicon wiring layer having a similar pattern to a polysilicon wiring pattern of the bit line balancing circuit 3.

Figure 2:
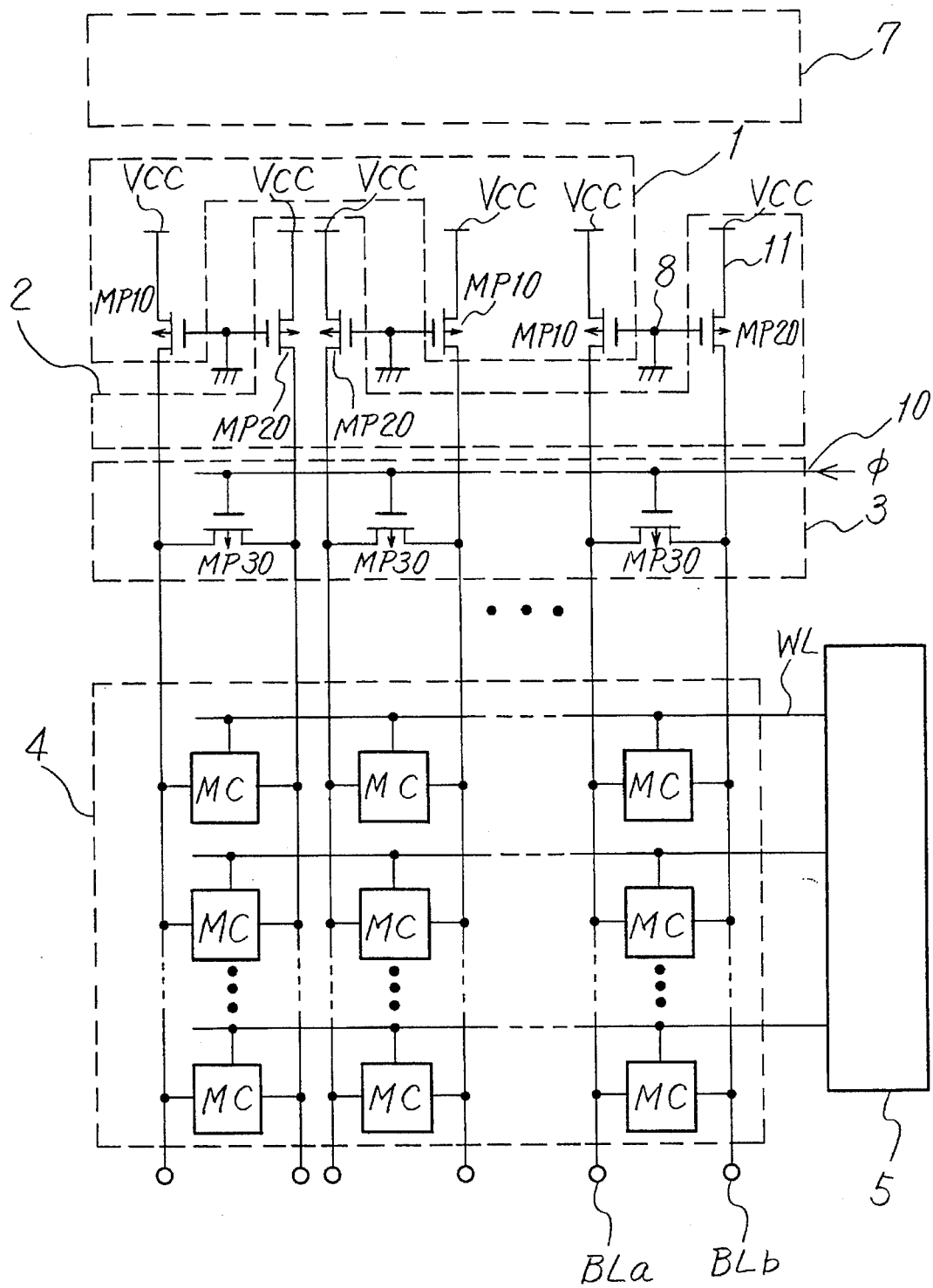
FIG. 2 is a circuit diagram showing a concrete circuit construction of the semiconductor memory device shown in FIG. 1.

Referring to FIGS. 1 and 2, each memory cell array region 4 includes a plurality of memory cells MCs arranged in array. Each memory cell MC is connected to a word line WL and a pair of bit lines BLa and BLb. The number of bit line pairs is equal to the number of columns of the memory cells. These bit line pairs are connected to the bit line balancing circuits and the bit line potential supply circuits 1 and 2, respectively.

The bit line balancing circuit 3 includes transistors MP 30 each having a source-drain circuit connected across the paired bit lines BLa and BLb and a gate connected to a wiring 10 for supplying a control signal φ, the number of the transistor MP 30 being equal to that of the bit line pairs.

The bit line potential supply circuit is divided to the first and second bit line potential supply circuit portions 1 and 2 so that an area to be occupied thereby is minimized as to be described later.

The bit line potential supply circuit portion 1 comprises a plurality of transistors MP10 each having a source-drain circuit connected between a voltage source Vcc and the bit line BLa and a gate grounded and the bit line potential supply circuit portion 2 comprises a plurality of transistors MP20 each having a source-drain circuit connected between a voltage source Vcc and the bit line BLb and a gate grounded. The transistors MP10 of the bit line potential supply circuit portion 1 and the transistors MP20 of the bit line potential supply circuit portion 2 are paired, respectively. The regions of the circuit portions 1 and 2 are interleaved as shown in FIG. 2 to accommodate to the semiconductor chip area economy.

The dummy wiring regions 7 are arranged adjacent the bit line potential supply circuit portion 1.

In a read operation of this semiconductor memory device, one of the word lines WL selected by the line decoder 5 is activated and memory contents of a plurality of memory cells MC connected to the selected word line WL are supplied to the respective bit line pairs associated therewith. Either the bit line or lines BLa or BLb become lower in potential than the source potential according to the memory contents of the respective memory cells MC and the remaining bit line or lines are in the source potential level. Difference in potential between the bit lines in pair is amplified by a sense amplifier (not shown) and sent through one bit line pair selected by a column decoder (not shown) to an output circuit (not shown), completing the read operation for one memory content. Before entering into a next read operation, the control signal φ is made active to make the transistor MP30 of the bit line balancing circuit 3 to thereby connect the paired bit lines BLa and BLb to each other and recover their potential to the source potential by the bit line potential supply circuit portions 1 and 2, making the next read operation ready.

Figure 3:
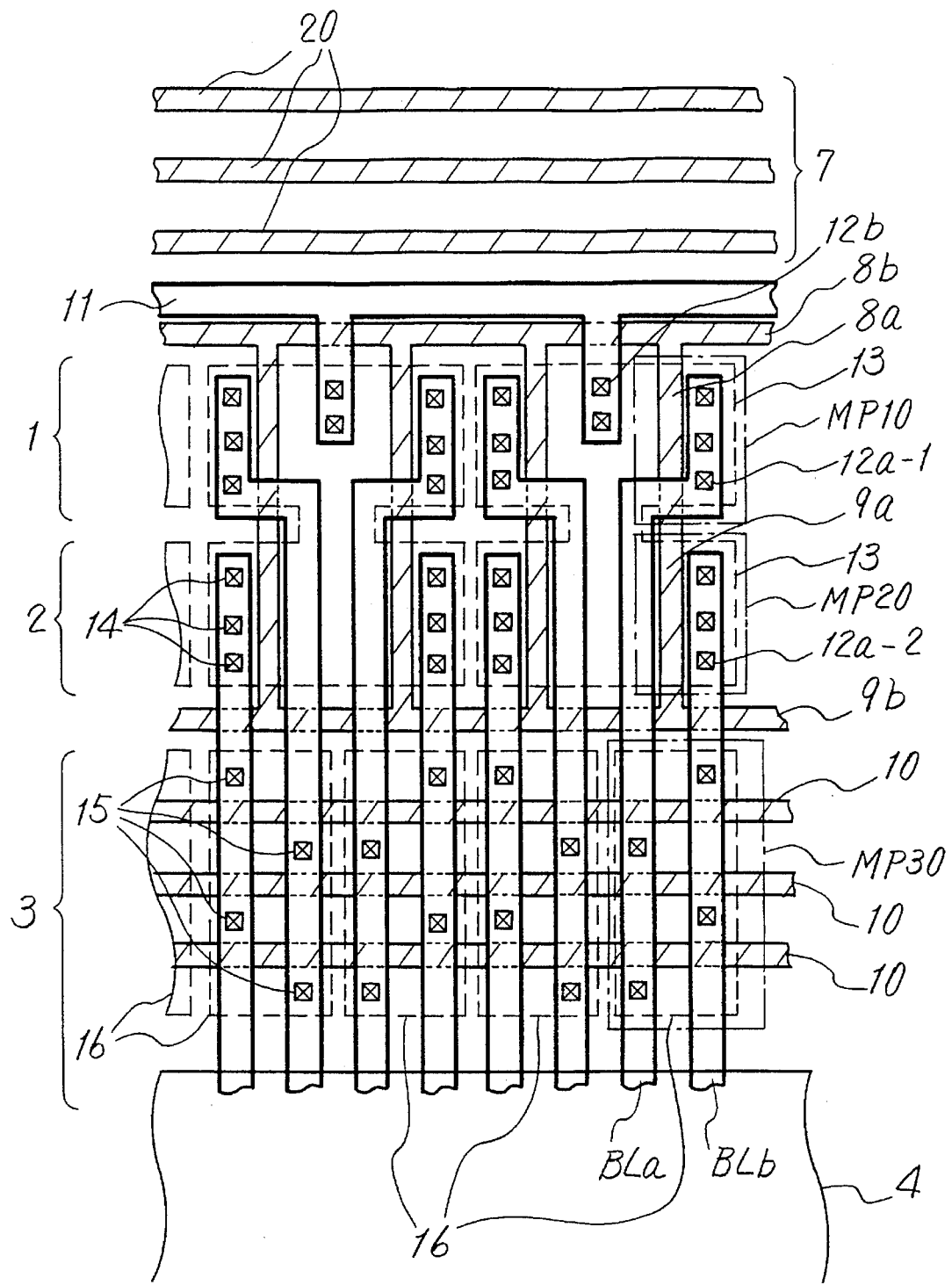
FIG. 3 is a plan view showing a wiring pattern of a portion of a bit line potential supply circuit and a portion of a bit line balancing circuit of the semiconductor memory device shown in FIG. 1.

FIG. 3 is a plan view of the bit line potential supply circuit (1, 2), the bit line balancing circuit 3 and the dummy wiring region 7, which are shown in FIG. 2. In FIG. 3, same reference numerals as those used in FIG. 2 are used to depict same components.

The transistors MP10 of the bit line potential supply circuit portion 1 are formed in a diffusion layer forming region 13 of the semiconductor chip. Each of gate electrodes of these transistors MP10 in the form of polysilicon film 8a is integral with polysilicon wiring 8b. Each of sources thereof is connected through a plurality of contact holes 12a-1 to the bit line BLa of aluminum film and each drain thereof is connected through a plurality of contact holes 12b to a source wiring 11 of aluminum film.

The transistors MP20 consitituting the bit line potential supply circuit portion 2 are also formed in the diffusion layer forming region 13. A gate of each transistor MP20 is formed as a polysilicon layer 9a which is integral with a polysilicon wiring 9b. A source thereof is connected through a plurality of contact holes 12a-2 to the bit line BLa and drains of the transistors MP20 are formed in the same region as that in which the drains of the transistors MP10 are formed. The drain of the transistor MP20 is connected through a plurality of contact holes 12b to the voltage source wiring 11.

The transistors MP30 constituting the bit line balancing circuit 3 are formed in another diffusion layer forming region 16 and a gate electrode of each transistor MP30 comprises three polysilicon wiring lines 10 and its source and drain are connected through contact holes 15 to the bit lines BLa and BLb, respectively.

The dummy wiring region 7 comprises a polysilicon wiring composed of a plurality of wiring lines 20, the number of the lines 20, the line width and the pitch thereof being the same as those of the polysilicon wiring 11, and is arranged on the chip separated from the bit line potential supply circuit portion 1 by a distance equal to a distance between the bit line potential supply circuit 2 and the bit line balancing circuit 3.

A fabrication of the semiconductor memory device according to this embodiment will be described. The memory array region 4 and the diffusion layer forming regions 13 and 16, etc., on the semiconductor substrate surface are partitioned from each other by selective oxidation of the substrate surface. Then, a gate oxide film is formed on the diffusion layer forming regions 13 and 16, etc., on which a polysilicon film doped with phosphor is deposited to thickness of 350 to 400 nm. Then, a positive type photoresist film is painted thereon and a pattern on a photo mask is transferred onto the photoresist film. In this manufacturing step, the gate electrode 8a, the polysilicon wiring 8b, the gates electrodes 9a and 9b of the bit line potential supply circuit portion 2, the gate electrodes 10 of the bit line balancing circuit 3 and the dummy wiring region 7 are formed simultaneously.

That is, by using the photoresist film having the predetermined pattern transferred as a mask, the polysilicon film is patterned by plasma etching, resulting in the gate electrodes 8a and 9a, the polysilicon wirings 8b and 9b and the dummy wiring region 7.

Figure 4:
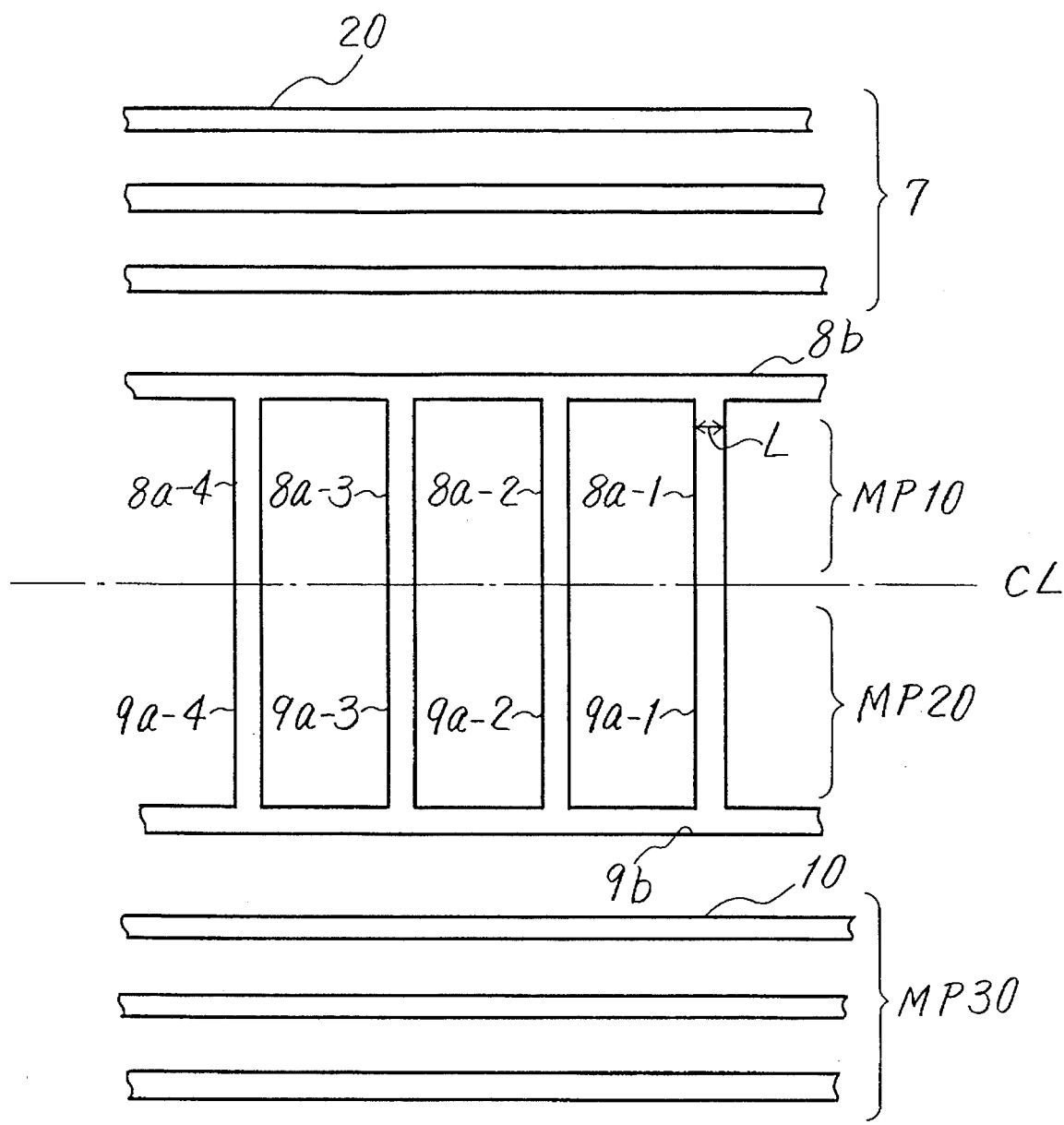
FIG. 4 is a plan view showing a wiring pattern of a polysilicon wiring layer of the wiring pattern shown in FIG. 3.

FIG. 4 shows a wiring pattern of the polysilicon film formed in this manufacturing step. As shown in FIG. 4, with the dummy wiring region 7 having the same number of wiring lines 20 as that of the wiring lines 10 of the bit line balancing circuit 3, the pattern becomes symmetrical with respect to a horizontal center line CL.

Then, the diffusion layer forming regions 13 and 16 are ion-implanted with using the gate electrode 8a and the polysilicon wiring 8b as a mask, resulting in source and drain regions for the transistors MP10, MP20 and MP30.

After deposition of interlayer insulating film and formation of the contact holes 12, 13 and 14, an aluminum film is deposited thereon to form the source wiring 11 and the bit lines BLa and BLb.

Thus, the semiconductor memory device according to the present invention is fabricated.

Figures 5, 6:
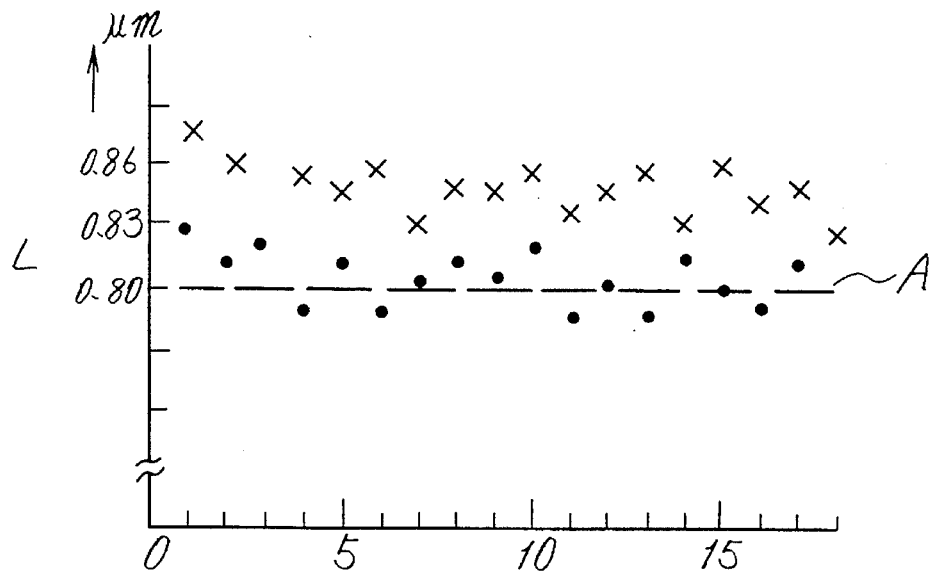
FIG. 5 is a graph showing variations of gate width of the first embodiment of the present invention and an example of the conventional semiconductor memory device with respect to a designed value.
FIG. 6 shows voltage level waveform and an output waveform of bit lines of the semiconductor memory device.

FIG. 5 is a graph showing variations of line width of the present wiring line and the conventional wiring line from a designed value which was selected as 0.8 μm, in which abscissa depicts the number of wiring line counted from 8a-1 in FIG. 4 leftwardly and ordinate depicts gate width L of the respective gate electrodes. In FIG. 5, black points show the width of the gate electrodes of the transistors MP10 of the bit line potential supply circuit portion 1 of the present embodiment and x shows those of the gate electrodes obtained according to the conventional technique. In this measurement, the designed width of the gate electrode 8a was 0.8 μm (line A in FIG. 5) with pitch of 5 μm.

As is clear from FIG. 5, in the present embodiment, a deviation of the line width from the designed value is within 0.03 μm in both dierections, while, in the conventional example, the line width exceeds the designed value by from 0.05 to 0.06 μm. The reason for such restriction of width deviation from the designed value obtainable by the present invention is that the polysilicon layer forming pattern including the gate electrodes 8a and 9a and the polysilicon wirings 8b and 9b is symmetrical due to the existence of the dummy wiring region 7 and thus there is no variation of diffraction of light in the mask pattern exposure for forming the polysilicon layer.

As mentioned previously, when the width of gate electrode increases and thus the channel length of a transistor becomes larger, mutual conductance of the transistor is reduced.

FIG. 6 is a graph quantitatively showing undesired effect of reduction of mutual conductance of transistor prepared by using the conventional technique, in which abscissa shows time t and ordinate shows potential of bit line and read output. In FIG. 6, reduction of mutual conductance of the transistors MP10 constituting the bit line potential supply circuit portion 1 causes the bit line potential from that shown by a solid line (1)a to that shown by a dotted line (1)b resulting a delay which causes a leading edge of read output of the semiconductor memory device to be changed from that shown by a solid line (2)a to that shown by a dotted line (2)b. The resultant delay may be about 2 to 3 n sec in the conventional example. This problem can be solved by the present invention.

In the above-mentioned embodiment of the present invention, the wiring pattern 20 of the dummy wiring region 7 has been described as being similar to the polysilicon wiring pattern 10, that is, as a polysilicon wiring having the same number of wiring lines, the same line width and the same pitch as those of the wiring pattern 10. However, the wiring pattern 20 is not required to be exactly the same as that of the wiring pattern 10 provided that the symmetricity between the wiring patterns 10 and 20 can be substantially maintained.

In addition to the tendency of increasing the line width of the polysilicon wiring layer of the bit line potential supply circuit portion 1 arranged in the periphery of the memory chip, the present inventors have found that the line width tends to increase locally around opposite end portions of respective wiring pattern of these polysilicon wiring layer. A second embodiment of the present invention is intended to solve this problem.

Figure 7:
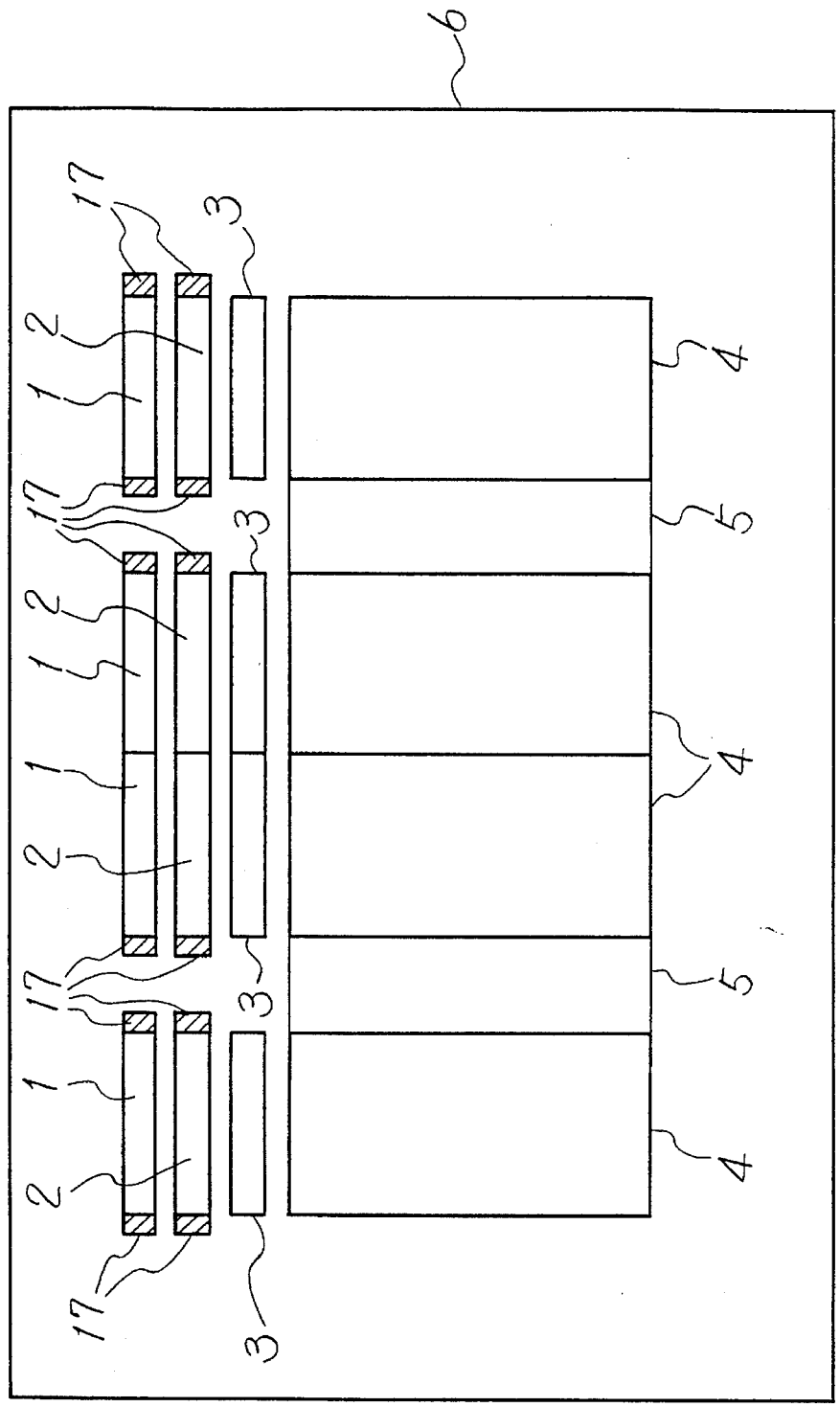
FIG. 7 is a plan view schematically showing a whole of a semiconductor memory device according to a second embodiment of the present invention.

Describing this in more detail, the increase of line width of the polysilicon wiring layer occurs in not only the bit line potential supply circuit 1 and 2 adjacent to the periphery of the memory chip but also lengthwise end portions of the patterns of the polysilicon wiring of the bit line potential supply circuit 1 and 2. In order to handle this, the second embodiment uses dummy wiring regions 17 provided in opposite end portions of the bit line potential supply circuit portions 1 and 2, as shown in FIG. 7. In the second embodiment shown in FIG. 7, constitutional components other than the dummy wiring regions 17 are the same as those in the first embodiment and therefore they are depicted by the same reference numerals, respectively, without any further explanation thereof.

Figure 8:
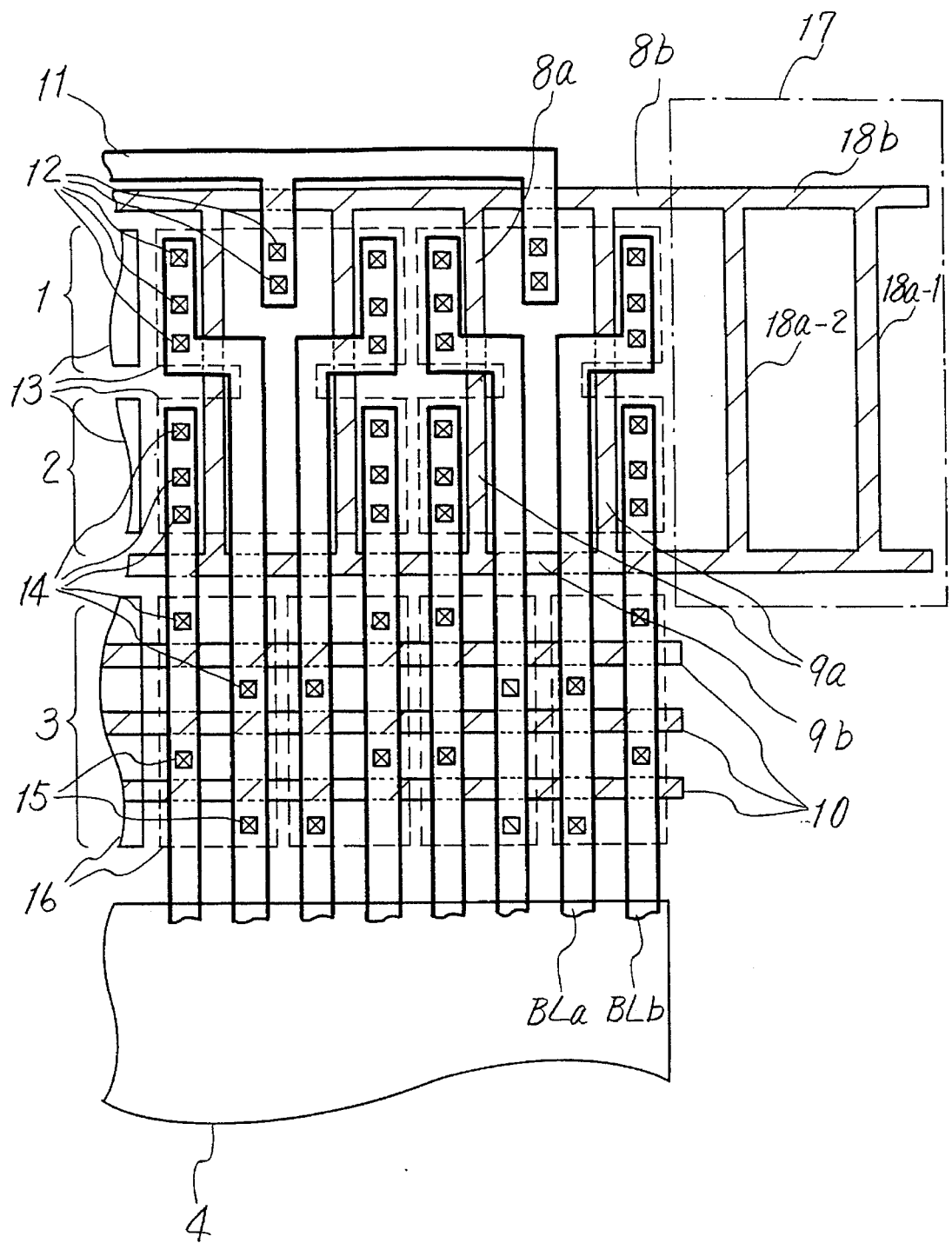
FIG. 8 is a plan view showing a wiring pattern of a portion of a bit line potential supply circuit and a portion of a bit line balancing circuit of the semiconductor memory device shown in FIG. 7.

FIG. 8 is a plan view of the bit line potential supply circuit portions 1 and 2, the bit line balancing circuit 3 and the dummy wiring region 17.

A pattern of transistors MP10 and MP20 constituting the bit line potential supply circuit portions 1 and 2 and transistors MP30 constituting the bit line balancing circuit 3 is the same as that shown in FIG. 3.

Figure 9:
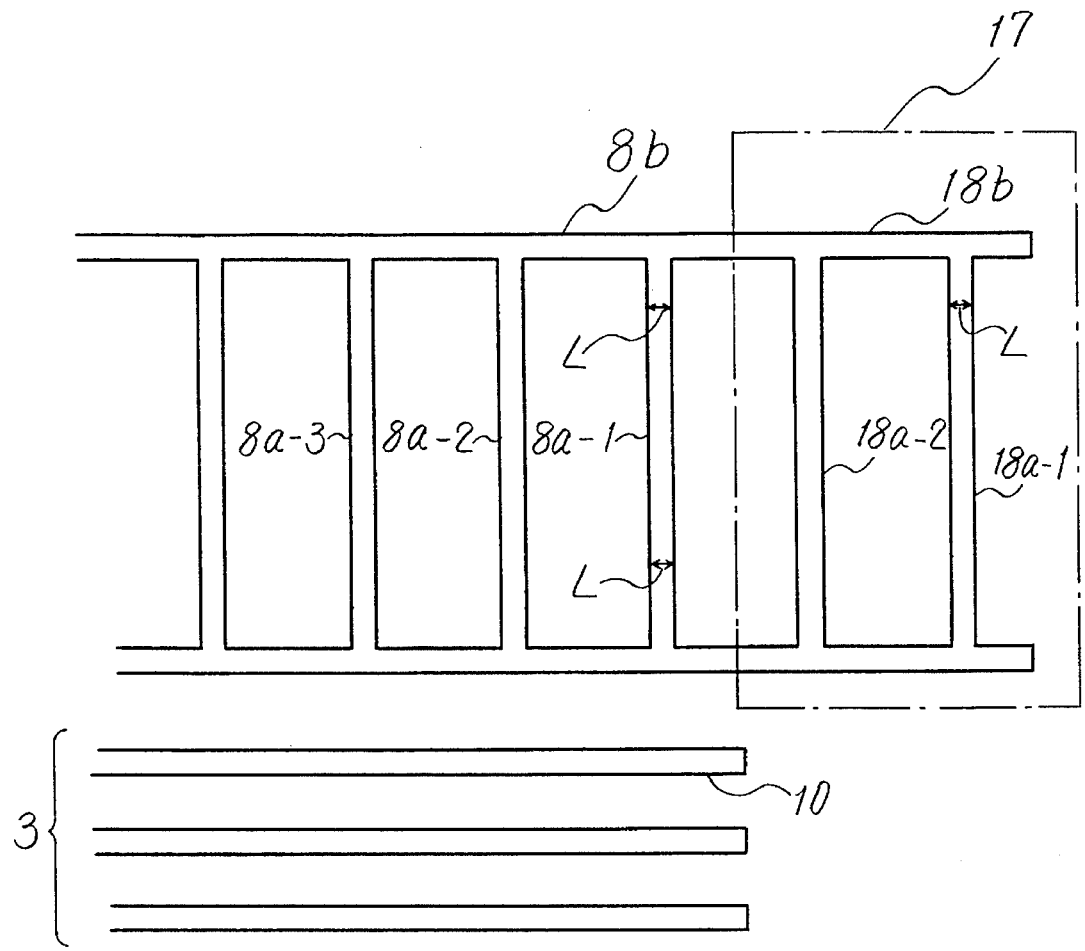
FIG. 9 is a plan view showing a wiring pattern of a polysilicon wiring layer of the wiring pattern shown in FIG. 7.

The dummy wiring region 17 has the same wiring pattern as that of the gate electrodes 8a and polysilicon wiring 8b and is provided in each of opposite and portions of each bit line potential supply portion. FIG. 9 is a plan view of only a polysilicon wiring pattern portion of the pattern construction. In FIG. 9, a polysilicon wiring layers 18a and 18b are arranged integrally with polysilicon layers 8a and 8b in the end portion of the bit line potential supply circuit portions 1 and 2. In this embodiment, the dummy wiring region 17 is constituted with two polysilicon wirings 18a and wirings 18b connected thereto.

Figure 10:
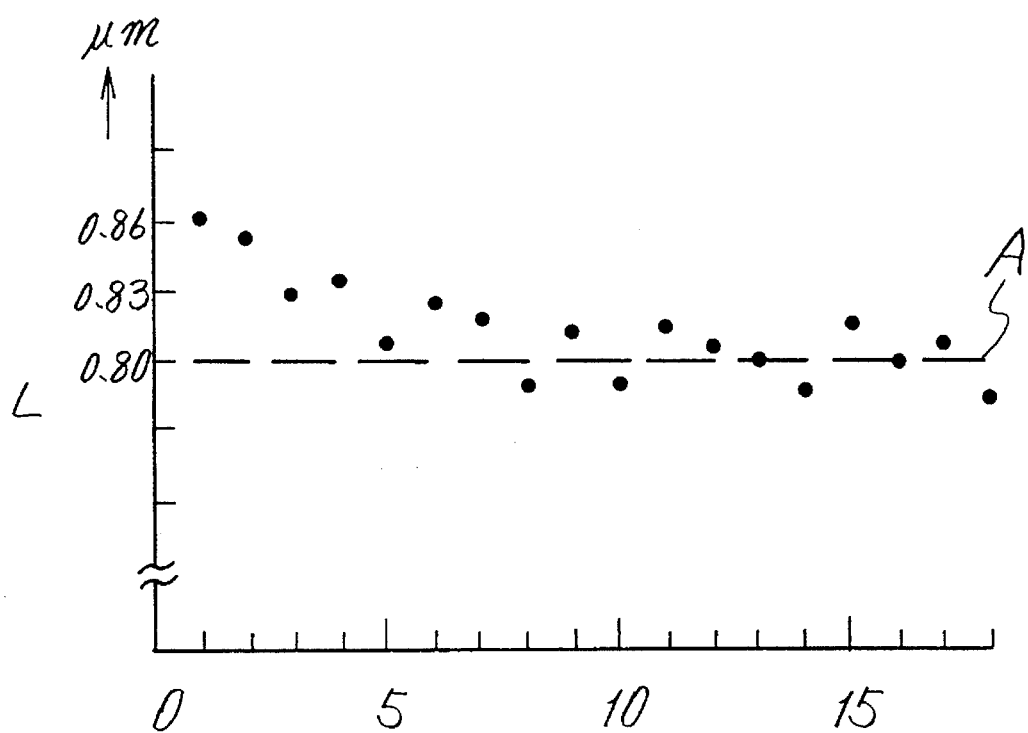
FIG. 10 is a graph showing variations of gate width of the second embodiment of the present invention and an example of the conventional semiconductor memory device with respect to a designed value.

As shown in a graph in FIG. 10 which is similar to the graph shown in FIG. 5, the effect of the dummy wiring region 17 provided adjacent each end portion of the bit line potential supply circuit is remarkable compared with the conventional example shown by x. In FIG. 10, the width of the gate electrode 8a is 0.8 µm with pitch of 5 µm as in the case shown in FIG. 5.

As is clear from FIG. 10, the line width L of the polysilicon wiring up to the second wiring line 18a-2 counted from the right side end of the pattern (FIG. 7) in the dummy wiring region 17 is larger than the designed value. However, for subsequent wiring lines, that is, gate electrode 8a-1, 8b, there is no substantial difference with respect to the designed value. Therefore, this embodiment restricts the increase of line width of the gate electrodes constituting the bit line potential supply circuit portions 1 and 2 and prevent mutual conductance of the transistors from being reduced.

In this embodiment, the dummy wiring region 17 is constituted with two polysilicon wirings 18b. However, with a larger number of the wirings 18b, the deviation of the line width from the designed value becomes smaller.

Further, by extending the gate electrode 10 of the transistors MP30 constituting the bit line balancing circuit 3 below the dummy wiring region 17 in FIG. 8, it is possible to further restrict the deviation of the line width of the, gate electrodes 8a and the polysilicon wiring layers 8b and 10.

In this embodiment, the line width and pitch of the wirings 18a and 18b constituting the dummy wiring region 17 are not required as exactly the same as those of the gate electrodes 8a and the wirings 8b provided that the pattern of the electrodes 8a and the wirings 8b is substantially similar to that of the wirings 18a and 18b in the dummy wiring region 17.

By combining the first and second embodiments, it is possible to remove the non-uniformity of gate width of the transistors constituting the bit line potential supply circuit portions 1 and 2 in both vertical and horizontal directions in FIG. 3 or 8 and thus the reduction of read/write rate or malfunction of the semiconductor memory device can be prevented.

In the first and second embodiments described hereinbefore, the gate electrodes off the transistors are formed of polysilicon. However, the present invention can be applied to a case where the gate electrodes are formed of aluminum.

Further, the present invention is not limited to SRAM. It is also applicable to DRAM (dynamic RAM), mask ROM, PROM (programmable read only memory), EPROM (erasable PROM), EEPROM (electrically erasable PROM), etc.

Although the present invention has been described with reference to specific embodiments, this description is not meant to be construed in a limiting sense. Various modifications of the disclosed embodiments will become apparent to persons skilled in the art upon reference to the description of the present invention. It is therefore contemplated that the appended claims will cover any modifications or embodiments as fall within the scope of the invention.

What is claimed is:

1. A semiconductor memory device comprising:
    a memory cell array including a plurality of word lines arranged in rows, a plurality of pairs of bit lines arranged in columns and a plurality of memory cells each disposed at a different one of intersections of said word lines and said pairs of bit lines,
    a plurality of pairs of wiring lines arranged in columns, each of said pairs of wiring lines extending continuously from an associated one of said pairs of bit lines to an external device,
    a bit line balancing circuit including a plurality of first transistors each having source-drain paths directly connected to an associated one of said pairs of wiring lines, respectively, said first transistors having respective gates connected in common to a first conductive line, said first conductive line being elongated along said memory cell array in parallel to said word line,
    a dummy conductive line formed along said first conductive line in parallel to said first conductive line, and
    a bit line potential supply circuit disposed between said first conductive line and said dummy conductive line and including a potential supply line and a plurality of pairs of second transistors, said potential supply line receiving a power voltage, each of said pairs of second transistors being connected between said potential supply line and an associated one of said pairs of said wiring lines and, when rendered conductive, supplying said power voltage to an associated one of said pairs of bit lines via said pairs of wiring lines, respectively.

2. The semiconductor memory device as claimed in claim 1, wherein each of said first conductive line and said dummy conductive line is made of polysilicon, said first conductive line having a plurality of portions serving as gates of said first transistors, respectively.

3. The semiconductor memory device as claimed in claim 2, wherein each of said pairs of second transistors having respective gates connected in common through a second conductive line which is made of polysilicon and arranged in a direction perpendicular to said first conductive line.

4. The semiconductor memory device as claimed in claim 3, wherein said bit line potential supply circuit further including a third conductive line made of polysilicon and formed along said first conductive line, said second conductive line in each of said pairs of second transistors is connected to said third conductive line.

5. A semiconductor memory device comprising:
    a memory cell array including a plurality of word lines arranged in rows, a plurality of bit lines arranged in columns and a plurality of memory cells each disposed at a different one of intersections of said word lines and said bit lines,
    a plurality of pairs of wiring lines arranged in columns, each of said pairs of wiring lines extending continuously from an associated one of said pairs of bit lines to an external device,
    a bit line potential supply circuit including a potential supply line and a plurality of transistors, said potential supply line receiving a power voltage, each of said transistors having a source region directly connected to said potential supply line and a drain region directly connected to an associated one of said wiring lines, said transistors having respective gate electrodes which are arranged in line along said memory cell array in parallel to said word line,
    a first dummy conductive line formed outside and adjacently to a most right-hand one of said gate electrodes, and
    a second dummy conductive line formed outside and adjacently to a most left-hand one of said gate electrodes,
    said first dummy conductive line and said second dummy conductive line being provided only to produce a substantially symmetrical wiring arrangement with respect to said gate electrode.

6. The semiconductor memory device as claimed in claim 5, wherein each of said gate electrodes and said first and second dummy conductive lines is made of polysilicon.

7. The semiconductor memory device as claimed in claim 6, wherein said bit line potential supply circuit further common conductive line formed along said memory cell array and elongated in parallel to said word line, said common conductive line being made of polysilicon, and said gate electrodes and said first and second dummy conductive lines being connected said common conductive line.

* * * * *